(12) United States Patent
Ermolov

(10) Patent No.: US 8,004,018 B2
(45) Date of Patent: Aug. 23, 2011

(54) FABRICATION METHOD OF ELECTRONIC DEVICES BASED ON ALIGNED HIGH ASPECT RATIO NANOPARTICLE NETWORKS

(75) Inventor: Vladimir Alexsandrovich Ermolov, Espoo (FI)

(73) Assignee: Nokia Corporation, Espoo (FI)

(*) Notice: Subject to any disclaimer, the term of this patent is extended or adjusted under 35 U.S.C. 154(b) by 159 days.

(21) Appl. No.: 12/317,919

(22) Filed: Dec. 29, 2008

(65) Prior Publication Data

US 2010/0163844 A1 Jul. 1, 2010

(51) Int. Cl.
*H01L 29/76* (2006.01)

(52) U.S. Cl. ........... 257/213; 257/E21.4; 438/478; 438/492; 438/503; 438/507; 438/800; 977/742; 977/891

(58) Field of Classification Search ........ 257/213, 257/E21.4; 438/478, 492, 503, 507, 800; 977/742, 891
See application file for complete search history.

(56) References Cited

U.S. PATENT DOCUMENTS

| 6,918,284 | B2* | 7/2005 | Snow et al. ........... 73/31.05 |
| 7,233,041 | B2* | 6/2007 | Duan et al. ........... 257/296 |
| 2005/0181143 | A1 | 8/2005 | Zhang et al. ........... 427/532 |
| 2006/0093749 | A1 | 5/2006 | Kim et al. |
| 2006/0228491 | A1 | 10/2006 | Choi et al. |
| 2007/0012961 | A1 | 1/2007 | Bae et al. |
| 2007/0059947 | A1 | 3/2007 | Moriya et al. ........... 438/780 |

FOREIGN PATENT DOCUMENTS

| WO | 2006/099749 | 9/2006 |
| WO | 2007/101906 | 9/2007 |
| WO | WO 2007/101907 | 9/2007 |

OTHER PUBLICATIONS

International Search Report (5 pages) and Written Opinion of the International Searching Authority (8 pages), 13 pages total.
"Postgrowth alignment of SWNTs by an electric field" by Zhou et al; Carbon, 2006, vol. 44, No. 1, pp. 170-173, doi:10.1016/j.carbon.2005.08.015.
"Electrostatic-directed deposition of nanoparticles on a field generating substrate" by Tsai et al; Nanotechnology, 2005, vol. 16, No. 9, pp. 1856-1862, doi:10.1088/0957-4484/16/9/073.
"Random networks of carbon nanotubes as an electronic material", E.S. Snow et al., Applied Physics Letters, V. 82, No. 13, pp. 2145-2147, Mar. 31, 2003.
"Novel carbon nanotube network deposition technique for electronic device fabrication", M.Y. Zavodchikova et al., phys. Stat. Sol. (b) 245, No. 10, pp. 2272-2275, 2008.
"High performance electronics based on dense, perfectly aligned arrays of single walled carbon nanotubes", S. J. Kang et al., Nature Nanotechnology, vol. 2, Apr. 2007.

* cited by examiner

Primary Examiner — Asok K Sarkar

(57) ABSTRACT

A layer of high aspect ratio nanoparticles is disposed on a surface of a substrate under the influence of an electrical field applied on the substrate. To create the electrical field, a voltage is applied between a pair of electrodes arranged near the substrate or on the substrate, and the high aspect ratio nanoparticles disposed on the substrate are at least partially aligned along direction(s) of the applied electrical field. The high aspect ratio nanoparticles are grown from catalyst nanoparticles in an aerosol, and the aerosol is directly used for forming the nanoparticle layer on the substrate at room temperature. The nanoparticles may be carbon nanotubes, in particular single wall carbon nanotubes. The substrate with the layer of aligned high aspect ratio nanoparticles disposed thereon can be used for fabricating nanoelectronic devices.

26 Claims, 9 Drawing Sheets

FABRICATION METHOD OF ELECTRONIC DEVICES BASED ON ALIGNED HIGH ASPECT RATIO NANOPARTICLE NETWORKS

TECHNICAL FIELD

This disclosure relates to nanostructured materials and their applications in microelectronic devices. In particular, this disclosure relates to a low cost process for making aligned structure of high aspect ratio nanoparticles and using the aligned structure of the high aspect ratio nanoparticles in fabricating the microelectronic devices.

BACKGROUND ART

Silicon-based complementary metal-oxide-semiconductor (CMOS) electronics have undergone remarkable progresses over the past 40-50 years. It is expected that, with new materials and device structures continuously being introduced for boosting the performance and reducing the cost, the CMOS electronics will continue to be the workhorse of the information technologies.

However, the silicon-based electronics are facing increasing amount of challenges in both low-end and high-end market segments.

In the low cost segment of the market, organic electronics have made tremendous progress over the last decade. A combination of a special type of organic materials and low-cost, large area fabrication processes (such as printing) enables the production of thin, lightweight, flexible and low-cost electronic devices. Currently, performance of the organic electronic devices is limited by very low mobility of charge carriers in the organic materials. This means the fabrication of radio frequency (RF) circuitries or fast display devices remains a challenge. Once these problems are solved, the organic electronic devices will be competing with the silicon-based devices.

In the high-end market segment, the CMOS microelectronics technologies are rapidly approaching the theoretical scaling limits. Further scaling efforts are expected to expend the devices into nano-electronics territory. For instance, a variety of devices based on the integration of individual high aspect ratio nanoparticles, which have a diameter of a few nanometers and a length of about 0.1-10 micron, have been demonstrated. A typical example of the high aspect ratio nanoparticles is carbon nanotubes (CNTs). Examples of such devices include field effect transistors (FETs), diodes, logic circuit elements, optical emission devices and different types of sensors.

In particular, one type of the carbon nanotubes, semiconducting single wall carbon nanotubes (SWNTs), is very promising as one-dimensional electronic material. SWNTs have some exceptionally interesting properties, for example a room temperature charge mobility as high as 100,000 cm$^2$/Vs (which is more than an order of magnitude larger than the mobility of crystalline silicon), current carrying capacity up to $10^9$ A/cm$^2$ and ON/OFF current ratio larger than $10^5$. These unique properties of the SWNTs have prompted researchers to fabricate devices with better performance and higher scaling density than traditional silicon-based electronic devices.

To the date, industrial scale processes for mass fabrication of single CNT based electronic circuits are not well established. Besides, because of the limited current-carrying capacity of individual CNT, multiple CNTs aligned side by side in a single device would be required in order to match the current density of a counterpart silicon-based device. A precise positioning of individual CNTs is beyond the capability of current growth and assembly technologies and it presents a major technological hurdle for CNT-based electronic applications.

On the other hand, instead of trying to manipulate individual high aspect ratio nanoparticles in the device fabrication, using a naturally formed layer of high aspect ratio nanoparticles in the device structure has been contemplated. A typical example is a carbon nanotube network (CNTN), which is an array of CNTs deposited on a substrate, much like a porous thin film. Using processes known in the art, randomly oriented CNTNs can be produced straightforwardly. If the density of the CNTN is sufficiently high, the nanotubes will interconnect and form continuous electrical paths. An attractive feature of the CNTN is that it retains many of the interesting electronics properties of an individual CNT while providing the processing capabilities for mass fabrication. Compared to organic or polymer semiconductive materials, CNTNs offer 10 times higher charge mobility, lower operating voltages and ability to be placed onto a wide variety of substrates.

The methods for fabricating the CNTNs may include: (1) localized synthesis processes in which a CNTN substrate is also a CNT growth substrate, and (2) remote synthesis processes in which CNTs are produced separately from the substrate, and are deposited on the substrate later on.

In the localized CNTN synthesis, a CNTN is grown on the substrate from nanometer-sized catalyst particles deposited at certain locations on the substrate. In this process, the CNT growth normally requires high growth temperatures (typically above 700° C.). This means that the substrate must be able to withstand elevated temperatures. The localized synthesis may be unacceptable for many substrates used in low cost electronics, especially for various types of polymer substrates.

The remote synthesis process allows for the CNTNs being produced on low temperature substrates such as silicon, glass and various polymers. The growth of the CNTs and the deposition of the CNTNs are separated in time and space. For example, CNTs can be grown in a free form and then be dispersed in a solution. The solution can be deposited on a substrate via spin coating or spraying. Then, the substrate is dried. It should be pointed out that dispersion of CNTs in a solution is an extremely difficult process.

Recently, an aerosol based remote synthesis process has been proposed. In the process, CNTs are synthesized in gas and then dry deposited on the substrate directly from the gas phase. A homogeneous CNTN is formed on the substrate at a low temperature. Compared to the solution-based methods, the aerosol-based method includes fewer steps. Therefore it is simple, low-cost and acceptable for mass production.

After a CNTN is deposited on the substrate, the microelectronic device structures are built on the substrate. Traditional integrated circuit (IC) fabrication methods may be used for patterning the CNTN layer, and depositing and pattering dielectric and metal layers. The simplest and most widely used way of patterning the CNTN in micrometer scale is the standard lithography and lift-off process.

For further improving device performance and manufacturing yield, it would be highly desirable if the nanotubes in the CNTN were at least partially oriented in a certain direction. This way, the subsequent device fabrication can advantageously use the direction of the orientation for enhancing the current carrying capability of the interconnecting nanotubes. There are known methods for CNT deposition and even CNT alignment. However, these methods are complex and expensive. In this disclosure, a low cost process for making a structure of high aspect ratio nanoparticles is introduced. The process is based on low temperature aerosol chemical vapor deposition and it is suitable for mass-production. In particular, the process is suitable for making CNTN substrates for CNT based nanoelectronic device fabrication. What's more, the process allows for the high aspect ratio nanoparticles being at least partially aligned. Further, a device fabrication method advantageously using the orientation of the nanoparticles for enhancing the current carrying capability is also introduced.

SUMMARY OF THE INVENTION

In a first aspect of the invention, a method is provided. The method comprises providing an aerosol suspension of high aspect ratio nanoparticles, and disposing a layer of the high aspect ratio nanoparticles on a surface of a substrate under the influence of an electrical field applied on the substrate. The high aspect ratio nanoparticles disposed on the substrate are at least partially aligned.

In the method, the high aspect ratio nanoparticles may be carbon nanotubes in individual or bundled form, or carbon nanowires. The carbon nanotubes may be single wall carbon nanotubes.

In the above method, providing the aerosol suspension of the high aspect ratio nanoparticles may comprise providing an aerosol suspension of catalyst nanoparticles, and growing the high aspect ratio nanoparticles on surfaces of the catalyst nanoparticles in the aerosol suspension of the catalyst nanoparticles.

The aerosol suspension may comprise carbon monoxide as carrier gas. At least 50% of the high aspect ratio nanoparticles in the aerosol suspension may be electrically charged. The catalyst may be one of the following elements: iron, nickel, platinum and cobalt.

In the above method, a voltage may be applied between a pair of electrodes arranged near the substrate to create the electrical field, and the high aspect ratio nanoparticles disposed on the substrate are at least partially aligned along direction(s) of the applied electrical field.

Alternatively, in the above method, a voltage may be applied between a pair of conductive contacts disposed on the substrate to create the electrical field, and the high aspect ratio nanoparticles disposed on the substrate are at least partially aligned along direction(s) of the applied electrical field.

In a second aspect of the invention, a base plate for forming an electronic device structure thereon is provided. The base plate comprises a substrate, and a layer of high aspect ratio nanoparticles disposed on at least one surface of the substrate. The high aspect ratio nanoparticles on the substrate are at least partially aligned. The layer of the high aspect ratio nanoparticles is disposed on the substrate by a process that comprises providing an aerosol suspension of the high aspect ratio nanoparticles, and disposing the layer of the high aspect ratio nanoparticles on a surface of the substrate under the influence of an electrical field applied on the substrate.

In the base plate the high aspect ratio nanoparticles may be carbon nanotubes in individual or bundled form, or carbon nanowires. The carbon nanotubes may be single wall carbon nanotubes.

In the base plate above, providing the aerosol suspension of the high aspect ratio nanoparticles may comprise providing an aerosol suspension of catalyst nanoparticles, and growing the high aspect ratio nanoparticles on surfaces of the catalyst nanoparticles in the aerosol suspension of the catalyst nanoparticles.

The aerosol suspension may comprise carbon monoxide as carrier gas. At least 50% of the high aspect ratio nanoparticles in the aerosol suspension may be electrically charged. The catalyst may be one of the following elements: iron, nickel, platinum and cobalt.

In the base plate above, a voltage may be applied between a pair of electrodes arranged near the substrate to create the electrical field, and the high aspect ratio nanoparticles disposed on the substrate are at least partially aligned along direction(s) of the applied electrical field.

Alternatively, in the base plate above, a voltage may be applied between a pair of conductive contacts disposed on the substrate to create the electrical field, and the high aspect ratio nanoparticles disposed on the substrate are at least partially aligned along direction(s) of the applied electrical field.

The base plate may further comprise a second layer of same or different high aspect ratio nanoparticles disposed on the substrate under the influence of a second electrical field applied on the substrate. The high aspect ratio nanoparticles in the second layer are at least partially aligned.

The base plate may be a semiconductor plate. The semiconductor plate has an insulator top layer, and the high aspect ratio nanoparticles are disposed on the insulator top layer.

In a third aspect of the invention, an electronic device structure is provided. The device structure comprises a first conductive terminal and a second conductive terminal, both disposed on a surface of a substrate and separated from each other by a distance, and a plurality of high aspect ratio nanoparticles connecting the first and the second conductive terminals across the distance. The high aspect ratio nanoparticles are at least partially aligned. The high aspect ratio nanoparticles are disposed on the substrate by a process that comprises providing an aerosol suspension of the high aspect ratio nanoparticles, and disposing the layer of the high aspect ratio nanoparticles on the substrate under the influence of an electrical field applied on the substrate.

In the device structure, the high aspect ratio nanoparticles may be carbon nanotubes in individual or bundled form, or carbon nanowires. The carbon nanotubes may be single wall carbon nanotubes.

The above device structure may further comprise an insulating layer, covering the first and the second conductive terminals and the plurality of high aspect ratio nanoparticles connecting the first and the second conductive terminals, and a third conductive terminal, disposed overlapping the plurality of high aspect ratio nanoparticles on the insulating layer or on another surface of the substrate opposing the first and a second conductive terminals. The first and the second conductive terminals form a source terminal and a drain terminal, respectively, and the third conductive terminal forms a gate terminal, of a field effect transistor.

In the above device structure, a voltage may be applied between the first conductive terminal and the second conductive terminal to create the electrical field, and the high aspect ratio nanoparticles are at least partially aligned along direction(s) of the applied electrical field.

Alternatively, in the above device structure, a voltage may be applied between a pair of electrodes arranged near the substrate to create the electrical field, and the high aspect ratio nanoparticles disposed on the substrate are at least partially aligned along direction(s) of the applied electrical field, and wherein the first and the second conductive terminals are arranged according to the alignment direction(s) of the high aspect ratio nanoparticles.

BRIEF DESCRIPTION OF THE DRAWINGS

The features and advantages of the invention will become apparent from a consideration of the subsequent detailed description presented in connection with accompanying drawings, in which.

DETAILED DESCRIPTION

In the following, the principle of the invention is explained through various examples. It is understood that the scope of the present invention is not limited by these particular examples.

Figure 1A:
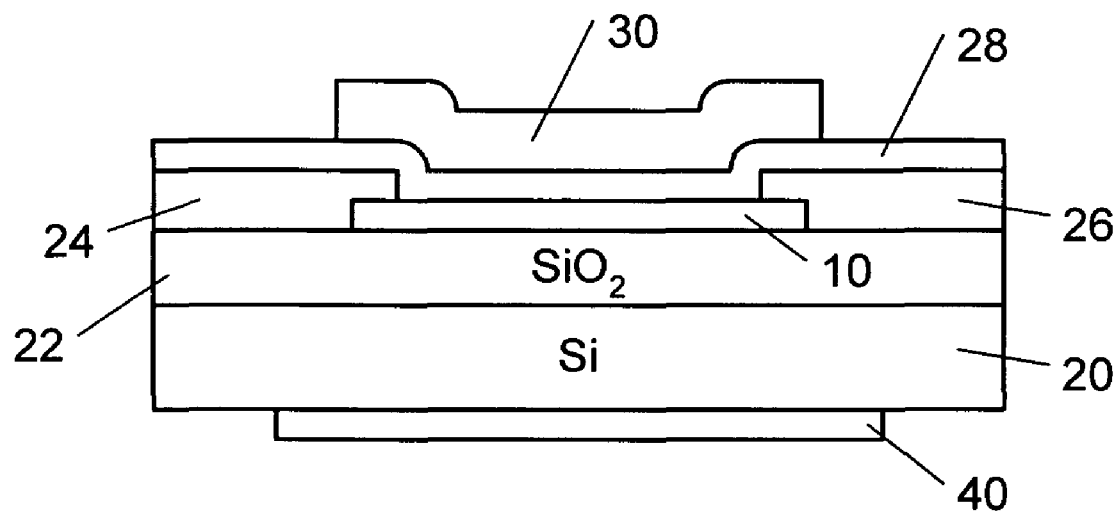
FIGS. 1(a) and 1(b) are schematic illustration of a top gate FET, 1(a) is a cross sectional view of the FET and 1(b) is a top view of the FET.
Figure 1B:
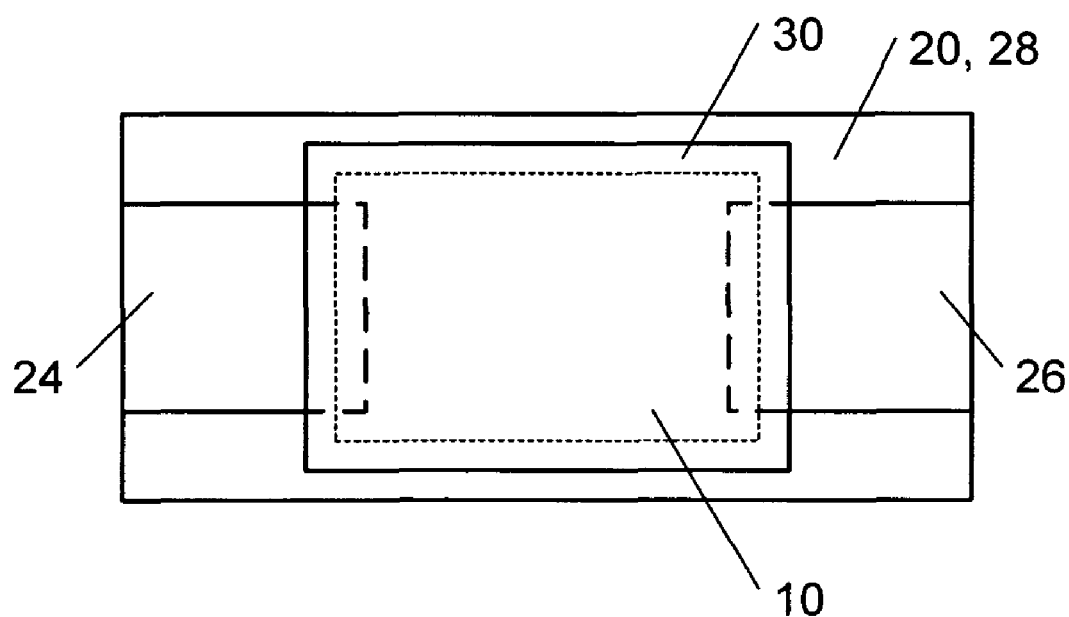

An exemplary structure of a top gate FET is shown in FIGS. 1(a) and 1(b). A network of semiconducting high aspect ratio nanoparticles (such as carbon nanotubes in individual or bundled form, or carbon nanowires, in particular, SWNTs are preferred) 10 is disposed on a substrate 20 having an insulating top layer 22 (such as a silicon substrate having a silicon dioxide ($SiO_2$) top layer). Two metal contacts 24 and 26 are disposed on the substrate 20, connecting via the CNTN 10. An insulator layer 28 is disposed on the CNTN 10 and the metal contacts 24 and 26. A third metal contact 30 is disposed on the insulator layer 28 above the CNTN 10. The CNTN 10 forms a channel between the two metal contacts 24 and 26 that act as a source terminal and a drain terminal, respectively, and the third metal contact 30 acts as a gate terminal. A back contact 40 is deposited on the side of the silicon substrate 20 opposing the channel 10.

Figure 2:
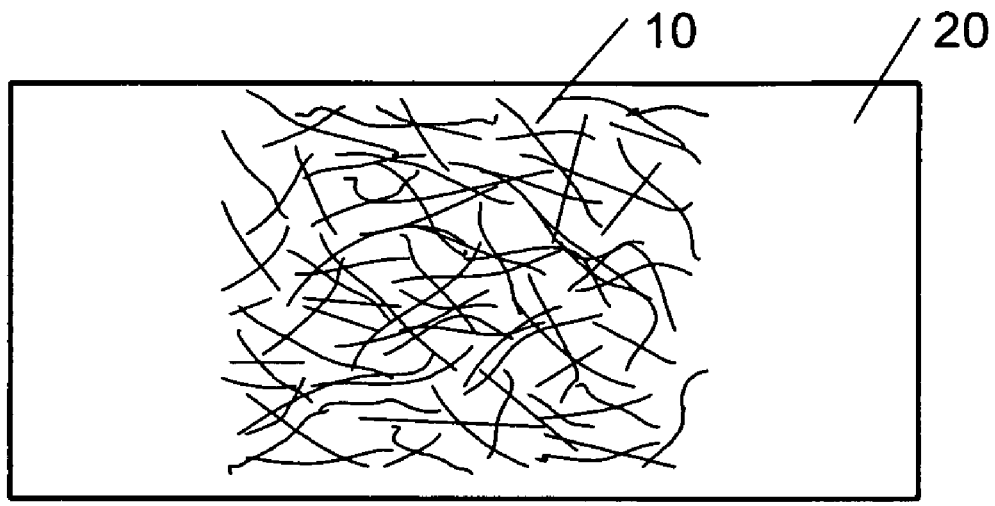
FIG. 2 illustrates a layer of randomly oriented CNTN deposited on a substrate.
Figure 3:
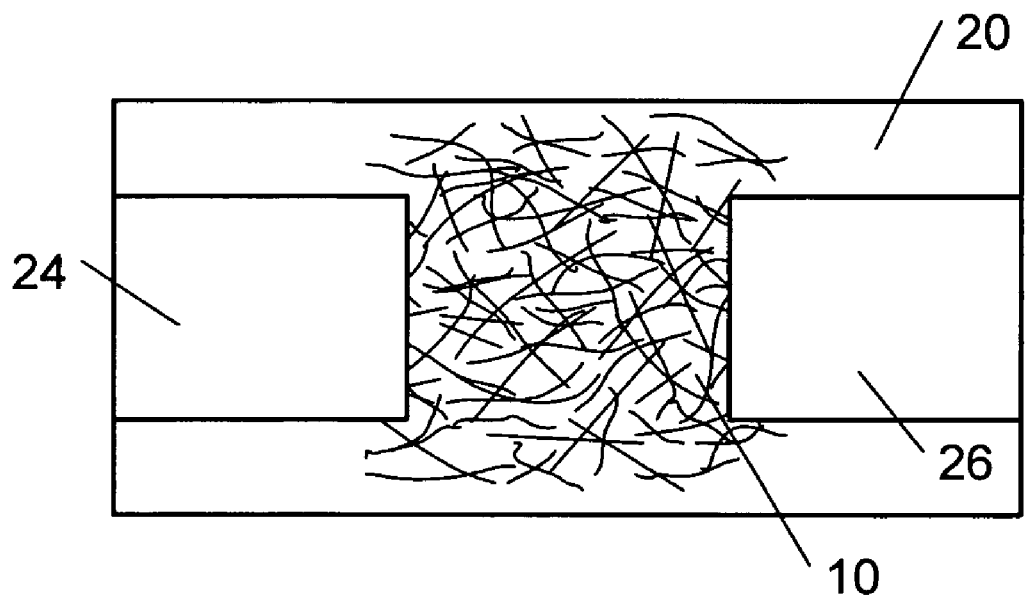
FIG. 3 is a schematic illustration of a FET channel built on the randomly oriented CNTN.

As schematically shown in FIG. 2, a state-of-the-art CNTN 10 is an array of CNTs deposited on a substrate 20 in random orientation. Interconnecting CNTs may form many electrical paths. Generally speaking, as shown in FIG. 3, the drain terminal and the source terminal (24, 26) may be disposed above the CNTN layer 10 or below the CNTN layer. The connecting between the terminals, the channel, is established via the interconnecting nanotubes. The gate terminal (not shown) may be located above the CNTN layer (top gate structure) or below the CNTN layer on the opposing surface of the substrate 20 (back gate structure). The channel current density of the device may depend on the number of the CNTs in the channel area.

For IC manufacturing, a single transistor gate is often less than tenth of a micron wide. This means if the CNTs are randomly oriented, the characteristics of the transistor may vary from one unit to another. If the CNTs are oriented in a certain direction and the transistor channel is made to be parallel to that direction, the device-to-device variation in transistor performance would be reduced, and manufacturing yield of the ICs would be improved.

Figure 4:
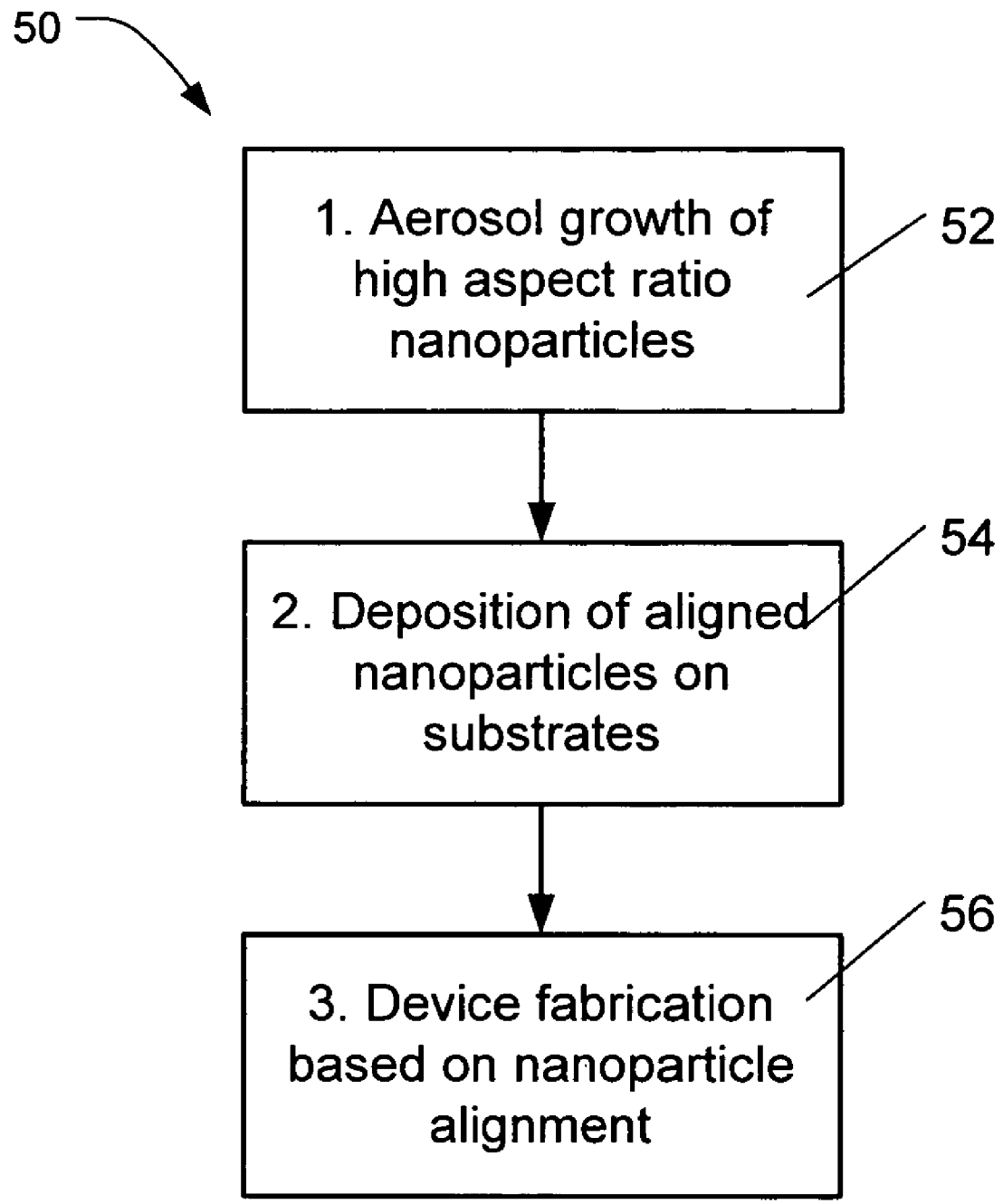
FIG. 4 is a flow diagram of a process for fabricating high aspect ratio nonoparticle based electronic devices.

Referring now to FIG. 4, a process 50 for fabricating nanoelectronic devices according to the present invention comprises three steps. The first step 52 includes an aerosol growth of high aspect ratio nanoparticles. In a particular embodiment, the growth of CNTs is described. The second step 54 includes low temperature chemical vapor deposition of aligned high aspect ratio nanoparticles on substrates. Particularly, the CNTs are dry-deposited on a substrate directly from the gas phase to form a homogeneous, aligned CNTN film on the substrates at a low temperature. The third step 56 includes device fabrication based on the nanoparticle alignment. The process is simple, low cost and suitable for mass fabrication.

1. CNT Synthesis

Figure 5:
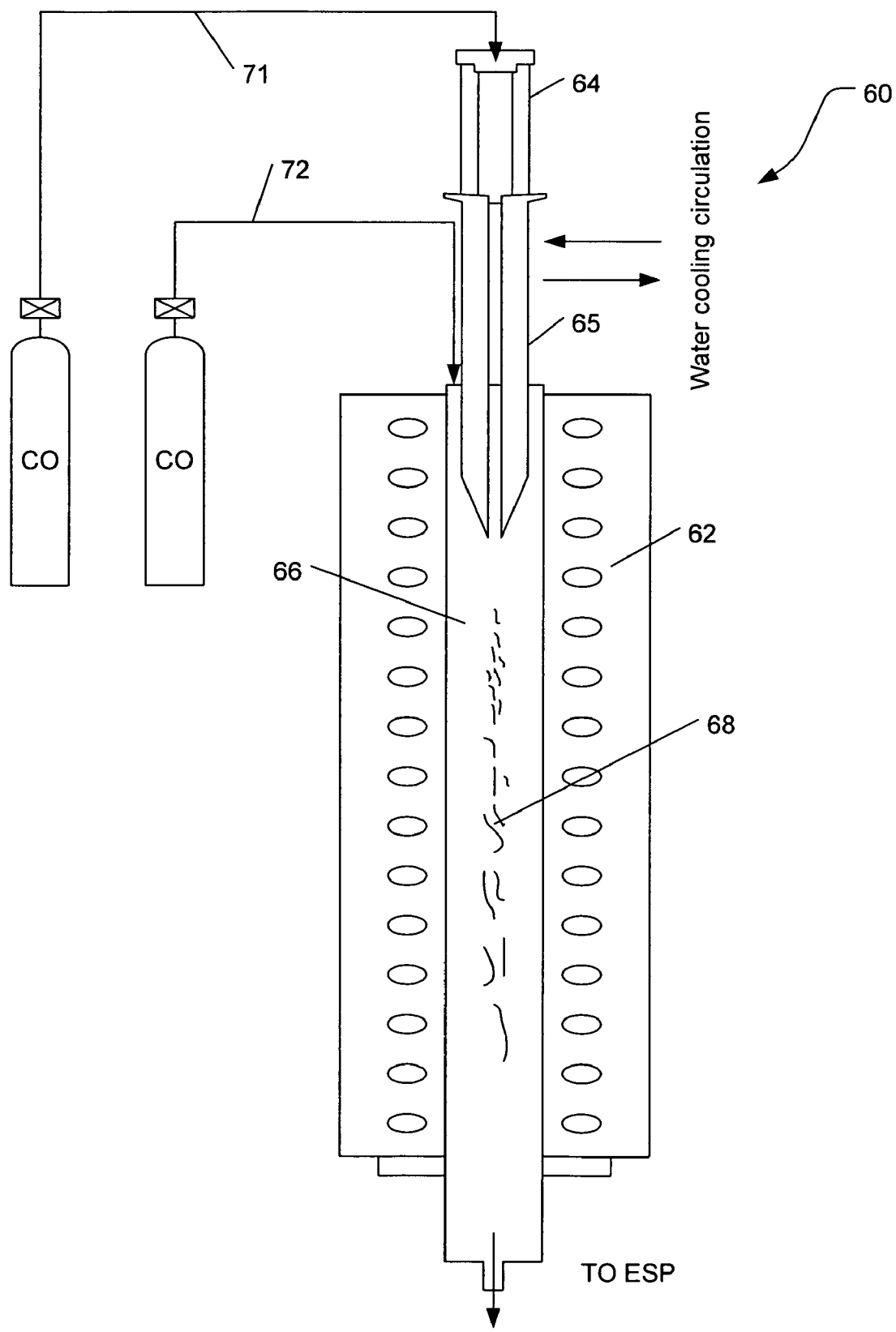
FIG. 5 is a schematic cross sectional view of a nanoparticle synthesis reactor.

The CNT synthesis is via the above-mentioned aerosol based remote synthesis process. As shown in FIG. 5, in one embodiment of the invention, CNTs, preferably SWNTs, are grown in a synthesis reactor 60 with the help of a catalyst. The catalyst may be produced in a catalyst generator 64 by vaporization from a resistively heated catalyst wire. Nanometer-sized catalyst particles are formed by vapor nucleation in carbon monoxide (CO) gas 71 (typical flow rate: 300 $cm^3$/min). The produced catalyst particles are introduced, through a water-cooled nozzle 65, into a ceramic tubular core 66 of the reactor 60 by a CO gas flow 72 (typical flow rate 100 $cm^3$/min). The catalyst nanoparticles are suspended in the CO gas. Temperature of the reactor core is controlled by a furnace 62. Suitable catalyst element include iron (Fe), nickel (Ni), platinum (Pt) and cobalt (Co), in which Fe is preferred.

The CNT growth takes place on the surfaces of the nanometer sized catalyst particles within a high temperature zone of the reactor (typical growth temperatures 800° C.-1000° C. for SWNT). The as-grown CNTs 68 may be in individual nanotube form or, more likely, in bundled nanotube form. The CNTs are suspended in an aerosol and the aerosol flows to the exit of the reactor 60. At the exit of the reactor there is an electrostatic precipitator (ESP) chamber.

2. CNTN Deposition and Orientation of the CNTs

Figure 6A:
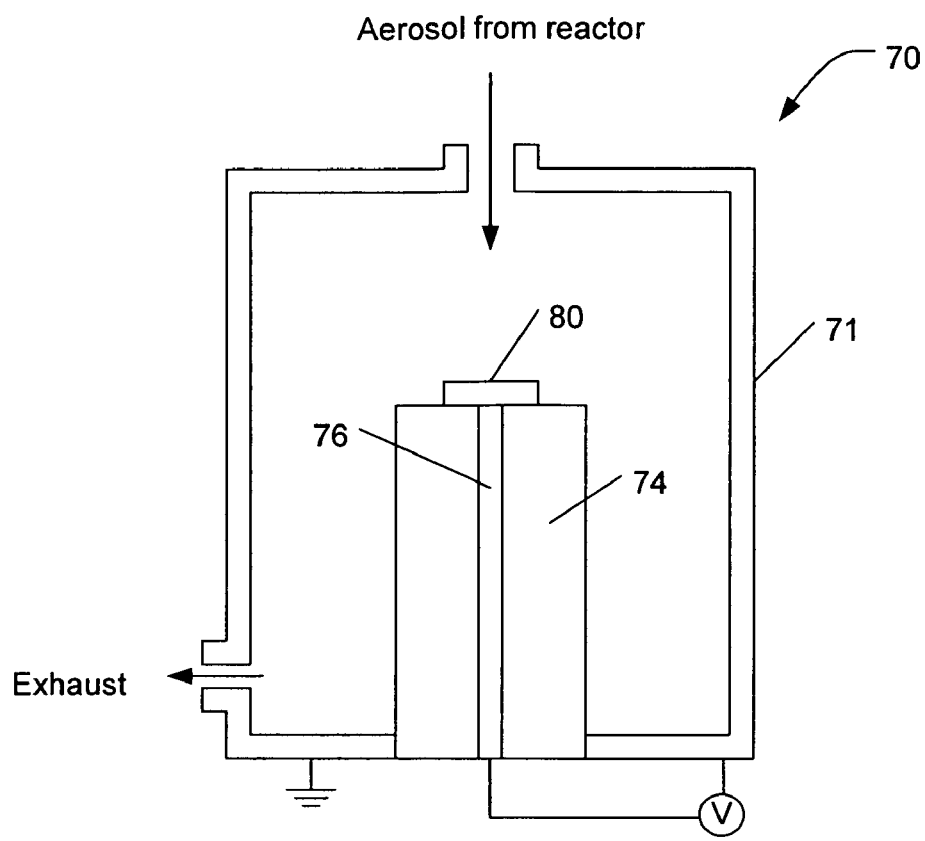
FIG. 6(a) is a schematic cross sectional view of an electrostatic precipitator (ESP) chamber.
Figure 6B:
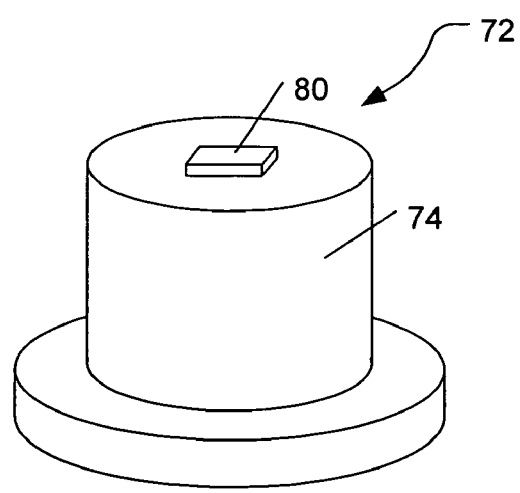
FIG. 6(b) is an illustration of the sample holder of the ESP chamber.

The aerosol carrying the as-grown CNTs leaves the reactor and enters the ESP chamber. As shown in FIG. 6, the ESP chamber comprises a cover 71, which opens to the synthesis reactor 60 at one end, and a sample holder 72, which is fitted with the cover 71. Inside the ESP chamber 70, a substrate 80 for depositing the CNTN thereon is placed on the sample holder 72 (see also FIG. 6(b)). The substrate 80 is kept at room temperature. Inside the sample holder 72, there is a central electrode 76 that is in electrical contact with the substrate 80. The electrode 76 and the cover 71 are electrically separated by an insulating material (such as Teflon) 74. In one embodiment, a DC voltage V is applied between the electrode 76 and the precipitator chamber cover 71, creating an electrical field around the area of the substrate 80. It is found that, when exiting the synthesis reactor, at least some of the individual and bundled CNTs are spontaneously charged (i.e. carrying electrical charges). Therefore, when the CNTs reach the surface of the substrate 80, those charged CNTs are subject to the electrical field. The electrical field creates mechanical dipole moments, which force the charge-carrying CNTs to align along the direction of the electrical filed. Thus, the electrical field can be used for both accelerating the CNT deposition and aligning the CNTs on the substrate. Under the influence of the electrical filed, the CNTs deposited directly from the gas phase on the substrate are at least partially aligned. For better alignment, the amount of the charged individual CNTs or CNT bundles is preferably more than 50%. More preferably, the amount of the charged individual CNTs or CNT bundles is more than 80%.

Without applying the electrical field, CNTs in the aerosol flow tend to go around the substrate, leaving very few nanotubes landing on the surface. The electrical field applied on surface of the substrate should have a value big enough for both accelerating the CNTN deposition and aligning the nanoparticles along predetermined direction(s). By varying the electrical field strength and collection time, the CNTN density can be controllably adjusted. For example, in order to obtain low density CNTNs close to the percolation threshold (~1-5 CNT bundles/$\mu m^2$), the collection time may be set between 30 and 120 seconds when the electrical field of ~2.5 kV/cm is applied.

The CNTN density $\rho_{calc}$ can be estimated according to the following formula:

$$\rho_{calc} = \frac{t \cdot C \cdot Q}{S} \quad (1)$$

where t is the collection time (minute), C is the CNT concentration change in the ESP with respect to an applied electrical field (CNT bundles/$cm^3$), Q is the aerosol flow rate ($cm^3$/min) and S is the substrate area ($\mu m^2$). Therefore, the CNTN density during the collection process can be controlled by simply adjusting the collection time.

Figure 7A:
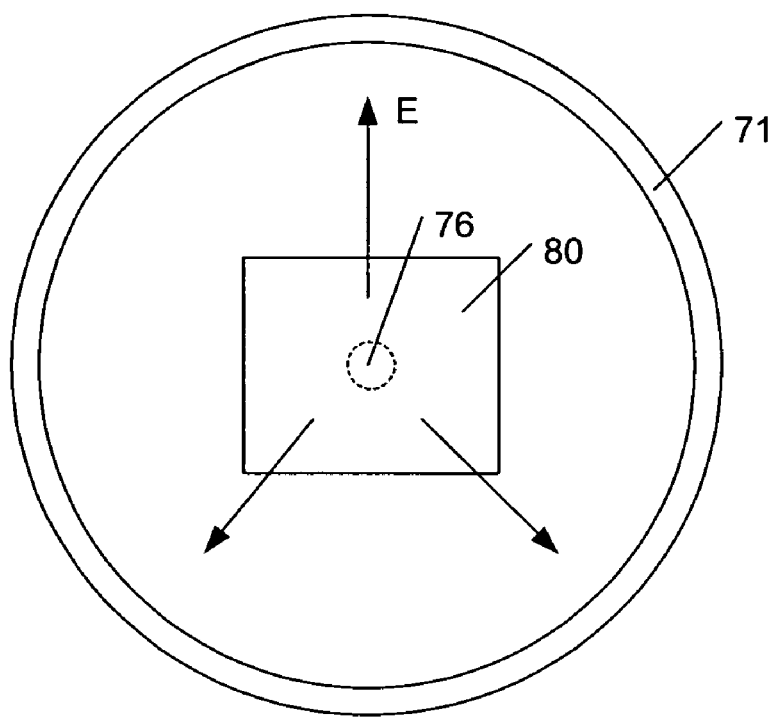
FIG. 7(a) shows schematically one exemplary arrangement of the electrical field in the ESP chamber.
Figure 7B:
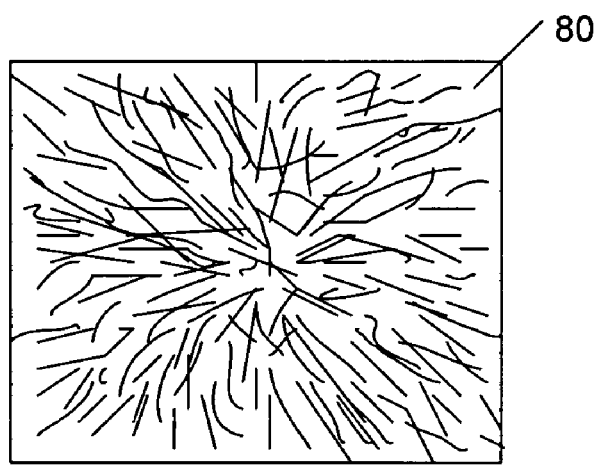
FIG. 7(b) illustrates schematically an oriented CNTN deposited on a substrate under the electrical field arrangement as shown in FIG. 7(a)

Because the CNTN deposition is done at a low temperature, different types of substrate, for example glass, silicon and various polymer substrates, can be used. Since the direction of the electrical field determines the orientation of the CNTs, it is possible to create various CNT orientation patterns by arranging the location(s) of the electrode(s) and adjusting the intensity of the electrical field. As an example, FIG. 7(a) shows, corresponding to FIGS. 6(a) and 6(b), the location of the central electrode 76 and the cover of the ESP chamber 71. When a DC voltage is applied between the central electrode 76 and the chamber cover 71, the substrate 80 has the same voltage potential as the central electrode 76. Arrows indicate the directions of the electrical filed. FIG. 7(b) shows the resulting distribution of the CNTs on the substrate 80. The CNTs are at least partially aligned along the directions of the electrical field.

Figure 8:
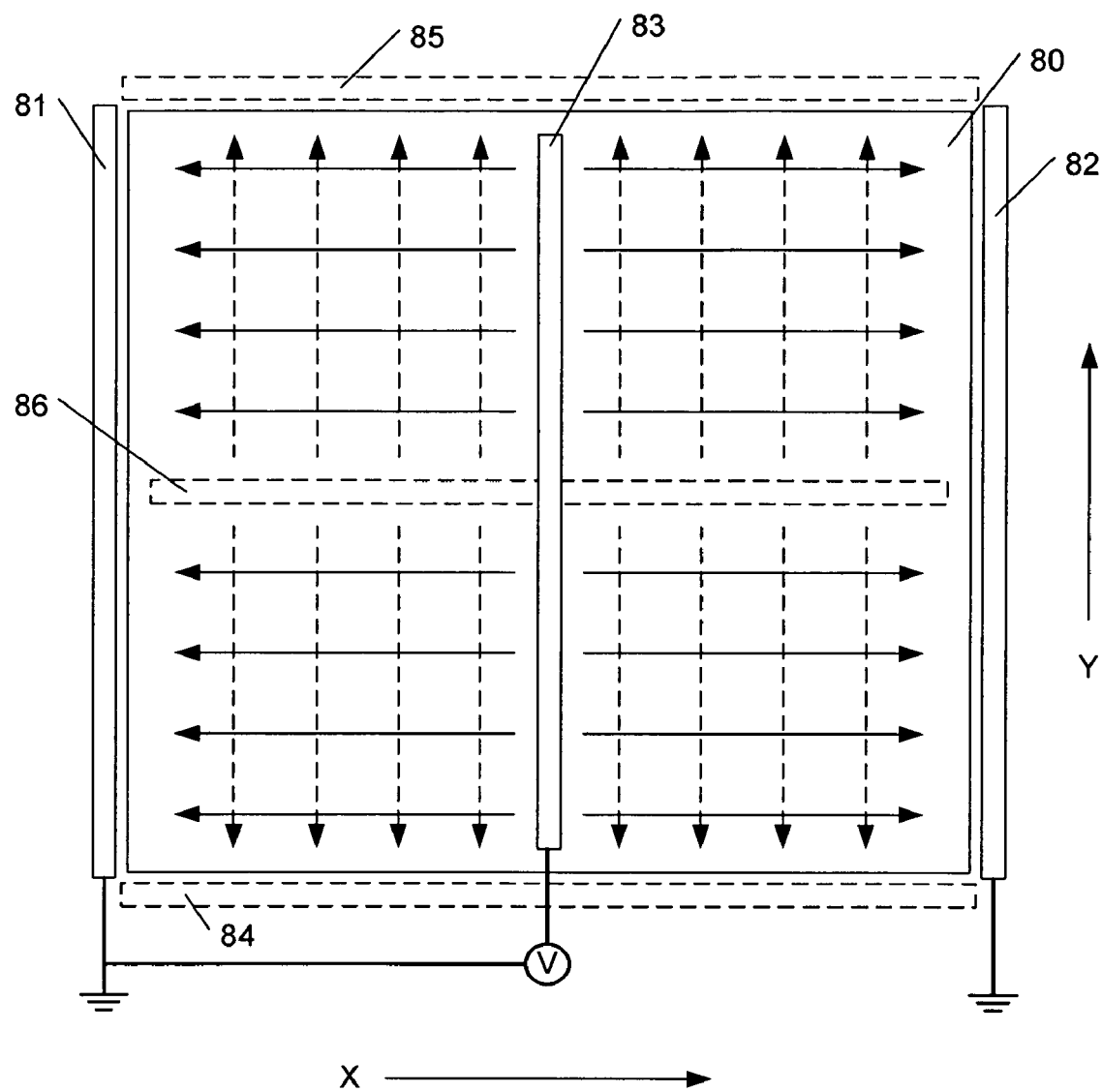
FIG. 8 shows schematically another exemplary arrangement of the electrical field in the ESP chamber.

FIG. 8 shows another example of electrode arrangement. A plurality of electrodes 81-86 are arranged around the substrate 80 (practically, the electrodes 81, 82, 84 and 85 may be arranged on each side of the substrate 80, respectively, and electrodes 83 and 86 may be arranged above or below the substrate). Electrodes 81, 82 and 83 are parallel to each other and perpendicular to the x-axis. Electrodes 84, 85 and 86 are parallel to each other and perpendicular to the y-axis. When a DC voltage V is applied between electrodes 83 and 81 and between electrodes 83 and 82, an electrical field is directed along the x-axis (arrowed solid lines). Thus, the deposited CNTs have a predominant alignment direction that is along the x direction. Similarly, when a DC voltage V is applied between electrodes 86 and 85 and between electrodes 86 and 84, an electrical field is directed along the y-axis (arrowed dashed lines), the CNTs are aligned predominantly along the y-axis.

Further, using the electrode configuration of FIG. 8, it is possible to create a multi-layered CNT film with different CNT orientations in each layer. For example, a first layer of the film can be created with a predominant alignment direction along the x-axis with a voltage applied between electrodes 83 and 81 and between electrodes 83 and 82. A second layer of the film can be created with a predominant alignment direction along the y-axis when the voltage applied is between electrodes 86 and 85 and between electrodes 86 and 84.

Figure 9A:
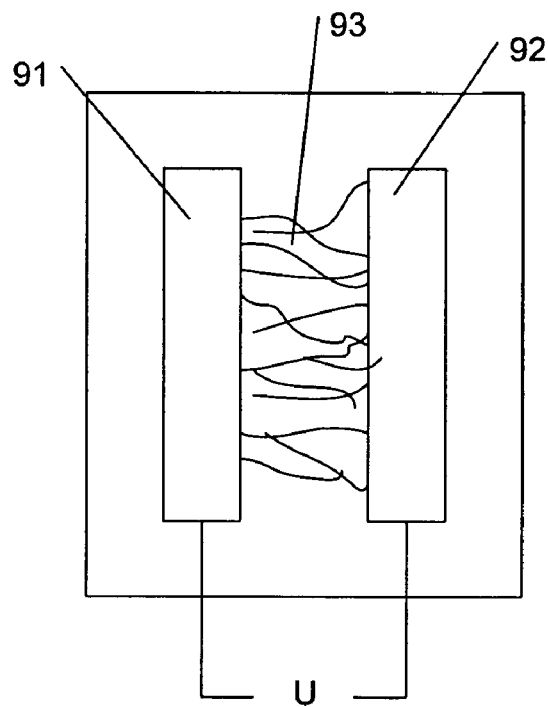
FIGS. 9(a) and 9(b) show arrangements of the electrical field, wherein the electrodes are located on the substrate.
Figure 9B:
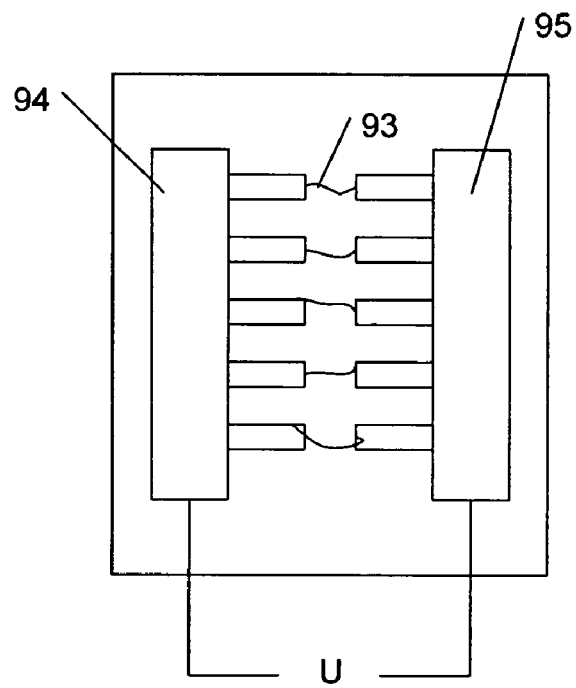

FIGS. 9(a) and 9(b) show yet another example of electrode arrangement. The electrodes may be in the form of metal contacts, such as the source and drain terminals of a FET. The metal contacts may be deposited on or attached to the surface of the substrate. FIG. 9(a) shows two strips of metal contacts 91 and 92, between which a DC or AC voltage u is applied. CNTs 93 may be deposited across the gap between the contacts 91 and 92. FIG. 9(b) shows, by example, that the electrodes or contacts 94 and 95 may be made in any shapes required by the IC design.

3. Electronic Device Fabrication

Device based on the aligned CNTN can be fabricated by any suitable methods known in the industry, for example lithography, shadow mask and so on. It is preferred that the device fabrication process takes advantage of the CNT alignment created in the above-described CNTN deposition process.

Electrical properties of the CNTN and corresponding performance characteristics of the devices may be affected by the alignment of the CNTs. It is expected that the CNT alignment will improve the device performance and device-to-device consistency. For example, in case of FET, optimum performance would be achieved if the CNTs were aligned across the transistor channel.

Figure 10A:
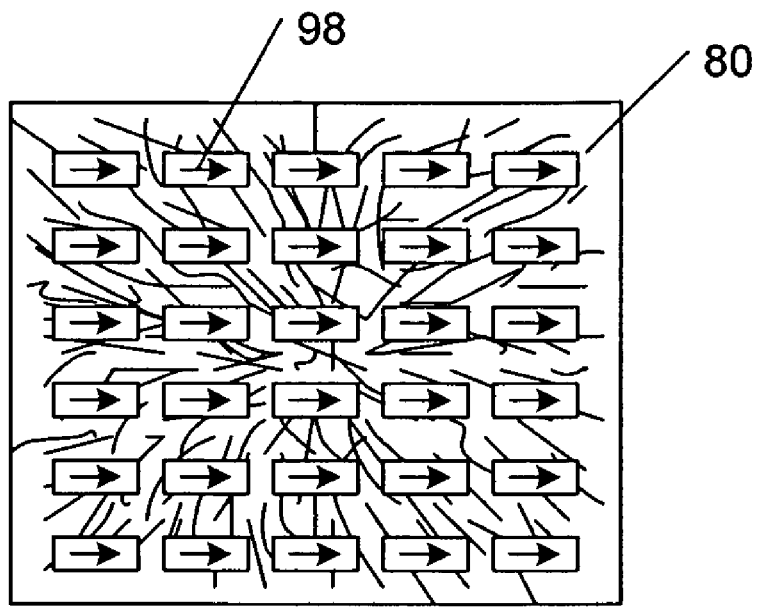
FIG. 10(a) shows a convention arrangement of transistor channels on an integrated circuit (IC) substrate.
Figure 10B:
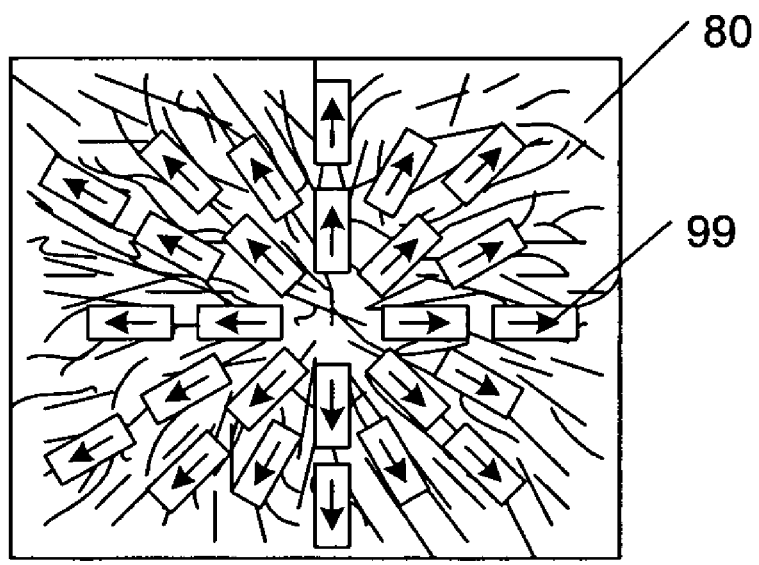
FIG. 10(b) shows a configuration of the transistor channels on the IC substrate, taking into account the CNTN orientations shown in FIG. 7(b).

The importance of selecting a right direction for a FET channel can be seen from FIGS. 10(a) and 10(b). FIG. 10(a) illustrates schematically how the masks for IC fabrication are designed today, in which all transistor channels are likely oriented along a certain direction (as indicated by the arrows 98). If such a mask is used on a substrate 80 in which the CNTs are distributed like that in FIG. 7(b), the resulted transistor channels may encompass different local distributions or orientations of the CNTs. Thus, the current carrying properties of the transistors may vary widely from one transistor to another, possibly causing low yields in IC manufacturing.

FIG. 10(b) demonstrates schematically how the masks should be designed according to the orientation of the CNTs. If the CNTs are distributed on a substrate 80 like that in FIG. 7(b), the transistor channels should be oriented according to the orientation of the CNTs (as indicated by the arrows 99). This way, the variation of local CNT distribution in the channel regions would be reduced. As the result, the yield of the ICs would be significantly improved.

In summary, the present disclosure pertains to a novel process of nanomaterial based electronic devices. The process combines an aerosol synthesis method for growing high aspect ratio nanoparticles with a dry deposition method under the influence of an applied electrical field. Accelerated deposition and alignment of the high aspect ratio nanoparticles on a substrate are achieved. The nanoparticles are aligned on the substrate along the directions of the electrical field, which can be arranged to suit the device fabrication needs. Improved device performance and manufacturing yield can be resulted by using such an aligned nanoparticle substrate and a proper mask design taking into consideration of the alignment.

It is to be understood that the above-described arrangements are only illustrative of the applications of the principles of the teachings hereof. In particular, it should be understood that although only a few examples have been shown, the teachings hereof are not restricted to those examples. Numerous modifications and alternative arrangements may be devised by those skilled in the art without departing from the scope of the present disclosure.

The invention claimed is:

1. A method, comprising:
providing an aerosol suspension of high aspect ratio nanoparticles,
disposing a layer of the high aspect ratio nanoparticles on a surface of a substrate under the influence of an electrical field applied on the substrate, wherein the high aspect ratio nanoparticles disposed on the substrate are at least partially aligned by arranging at least one pair of electrodes at locations near the surface of the substrate so that the high aspect ratio nanoparticles disposed on the substrate are at least partially aligned along directions of the applied electrical field in an alignment pattern made by arranging the locations of the pair of electrodes and by adjusting intensity of the electrical field, and
providing a mask over the surface, the mask comprising a mask pattern arranged to enhance alignment of the nanoparticles on the substrate along the alignment pattern.

2. The method of claim 1, wherein the high aspect ratio nanoparticles are carbon nanotubes in individual or bundled form, or carbon nanowires.

3. The method of claim 2, wherein the carbon nanotubes are single wall carbon nanotubes.

4. The method of claim 1, wherein providing the aerosol suspension of the high aspect ratio nanoparticles comprises:
providing an aerosol suspension of catalyst nanoparticles; and
growing the high aspect ratio nanoparticles on surfaces of the catalyst nanoparticles in the aerosol suspension of the catalyst nanoparticles.

5. The method of claim 4, wherein the aerosol suspension comprises carbon monoxide as carrier gas.

6. The method of claim 4, wherein at least 50% of the high aspect ratio nanoparticles in the aerosol suspension are electrically charged.

7. The process of claim 4, wherein the catalyst is one of the following elements: iron, nickel platinum and cobalt.

8. The method of claim 1, wherein one electrode of the at least one pair of electrodes comprises a cover of an electrostatic precipitator chamber and another electrode of the at least one pair of electrodes comprises a central electrode of a substrate holder for holding the substrate in the chamber for the deposition of the layer of the high aspect ratio nanoparticles on the surface of the substrate.

9. The method of claim 1, wherein the at least one pair of electrodes comprises one electrode near one side of the substrate and another electrode near another side of the substrate.

10. A base plate for forming an electronic device structure thereon, comprising:
a substrate; and
a layer of high aspect ratio nanoparticles disposed on at least one surface of the substrate;
wherein the high aspect ratio nanoparticles on the substrate are at least partially aligned, and
wherein the layer of the high aspect ratio nanoparticles is disposed on the substrate by a process that comprises:
providing an aerosol suspension of the high aspect ratio nanoparticles;
disposing the layer of the high aspect ratio nanoparticles on a surface of the substrate under the influence of an electrical field applied on the substrate, wherein a voltage is applied between at least one pair of electrodes arranged near the at least one surface of the substrate to create the electrical field, and the high aspect ratio nanoparticles disposed on the substrate are at least partially aligned along directions of the applied electrical field in an alignment pattern made by arranging the locations of the at least one pair of electrodes and by adjusting intensity of the electrical field; and
providing a mask over the surface, the mask comprising a mask pattern arranged to enhance alignment of the nanoparticles on the substrate along the alignment pattern.

11. The base plate of claim 10, wherein the high aspect ratio nanoparticles are carbon nanotubes in individual or bundled form, or carbon nanowires.

12. The base plate of claim 11, wherein the carbon nanotubes are single wall carbon nanotubes.

13. The base plate of claim 10, wherein providing the aerosol suspension of the high aspect ratio nanoparticles comprises:
providing an aerosol suspension of catalyst nanoparticles; and
growing the high aspect ratio nanoparticles on surfaces of the catalyst nanoparticles in the aerosol suspension of the catalyst nanoparticles.

14. The base plate of claim 13, wherein the aerosol suspension comprises carbon monoxide as carrier gas.

15. The base plate of claim 13, wherein at least 50% of the high aspect ratio nanoparticles in the aerosol suspension are electrically charged.

16. The base plate of claim 13, wherein the catalyst is one of the following elements: iron, nickel, platinum and cobalt.

17. The base plate of claim 10, further comprising:
a second layer of same or different high aspect ratio nanoparticles disposed on the substrate under the influence of a second electrical field,
wherein the high aspect ratio nanoparticles in the second layer are at least partially aligned.

18. The base plate of claim 10, wherein the substrate is a semiconductor plate, the semiconductor plate has an insulator top layer, and the high aspect ratio nanoparticles are disposed on the insulator top layer.

19. The base plate of claim 10, wherein one electrode of the at least one pair of electrodes comprises a cover of an electrostatic precipitator chamber and another electrode of the at least one pair of electrodes comprises a central electrode of a substrate holder for holding the substrate in the chamber for the deposition of the layer of the high aspect ratio nanoparticles on the surface of the substrate.

20. The base plate of claim 10, wherein the at least one pair of electrodes comprises one electrode near one side of the substrate and another electrode near another side of the substrate.

21. An electronic device structure, comprising;
a first conductive terminal and a second conductive terminal, both disposed on a surface of a substrate and separated from each other by a distance; and
a plurality of high aspect ratio nanoparticles connecting the first and the second conductive terminals across the distance;
wherein the high aspect ratio nanoparticles are at least partially aligned, and
wherein the high aspect ratio nanoparticles are disposed on the substrate by a process that comprises:
providing an aerosol suspension of the high aspect ratio nanoparticles, disposing the layer of the high aspect ratio nanoparticles on the surface of the substrate under the influence of an electrical field, wherein a voltage is applied between at least one pair of electrodes arranged near the surface of the substrate to create the electrical field, and the high aspect ratio nanoparticles disposed on the substrate are at least partially aligned along directions of the applied electrical field in an alignment pattern made by arranging the locations of the at least one pair of electrodes and by adjusting intensity of the electrical field, and wherein the first and the second conductive terminals are arranged according to the alignment directions of the high aspect ratio nanoparticles, and providing a mask over the surface, the mask comprising a mask pattern arranged to enhance alignment of the nanoparticles on the substrate along the alignment pattern.

22. The device structure of claim 21, wherein the high aspect ratio nanoparticles are carbon nanotubes in individual or bundled form, or carbon nanowires.

23. The device structure of claim 22, wherein the carbon nanotubes are single wall carbon nanotubes.

24. The device structure of claim 21, further comprising:
an insulating layer, covering the first and the second conductive terminals and the plurality of high aspect ratio nanoparticles connecting the first and the second conductive terminals; and
a third conductive terminal, disposed overlapping the plurality of high aspect ratio nanoparticles on the insulating layer or on another surface of the substrate opposing the first and a second conductive terminals;
wherein the first and the second conductive terminals form a source terminal and a drain terminal, respectively, and the third conductive terminal forms a gate terminal, of a field effect transistor.

25. The electronic device structure of claim 21, wherein one electrode of the at least one pair of electrodes comprises a cover of an electrostatic precipitator chamber and another electrode of the at least one pair of electrodes comprises a central electrode of a substrate holder for holding the substrate in the chamber for the deposition of the layer of the high aspect ratio nanoparticles on the surface of the substrate.

26. The electronic device of claim 21, wherein the at least one pair of electrodes comprises one electrode near one side of the substrate and another electrode near another side of the substrate.

* * * * *